United States Patent
Lee et al.

(10) Patent No.: US 7,482,189 B2
(45) Date of Patent: Jan. 27, 2009

(54) LIGHT EMITTING DIODE AND METHOD OF FABRICATING THE SAME

(75) Inventors: Jeong-wook Lee, Seongnam-si (KR);
Vassili Leniachine, Suwon-si (KR);
Mi-jeong Song, Suwon-si (KR); Suk-ho Yoon, Seoul (KR); Hyun-soo Kim, Hwaseong-si (KR)

(73) Assignee: Samsung Electro-Mechanics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 11/896,634

(22) Filed: Sep. 4, 2007

(65) Prior Publication Data

US 2008/0032436 A1   Feb. 7, 2008

(51) Int. Cl.
*H01L 27/25* (2006.01)
*H01L 29/22* (2006.01)

(52) U.S. Cl. .................. 438/40; 438/22; 438/24; 438/46; 438/47; 257/94; 257/81; 257/85; 257/79

(58) Field of Classification Search ............ 438/22, 438/24, 40, 46, 47; 257/94, 81, 85, 79
See application file for complete search history.

(56) References Cited

U.S. PATENT DOCUMENTS

| | | | |
|---|---|---|---|
| 6,828,591 B2 * | 12/2004 | Okuyama et al. | 257/89 |
| 6,855,958 B2 | 2/2005 | Sato et al. | |
| 6,900,473 B2 * | 5/2005 | Yoshitake et al. | 257/95 |
| 7,332,365 B2 * | 2/2008 | Nakamura et al. | 438/29 |
| 2005/0001227 A1 | 1/2005 | Niki et al. | |
| 2006/0038190 A1 * | 2/2006 | Park et al. | 257/95 |

FOREIGN PATENT DOCUMENTS

JP   2002-185040 A   6/2002

OTHER PUBLICATIONS

Office Action issued by the Korea Patent Office on Jul. 26, 2006.

* cited by examiner

*Primary Examiner*—Kenneth A Parker
*Assistant Examiner*—Joseph Nguyen
(74) *Attorney, Agent, or Firm*—Buchanan Ingersoll & Rooney PC

(57) ABSTRACT

A light emitting diode (LED) and a method are provided for fabricating the a LED with an improved structure for better light emitting efficiency and better light output performance. The LED includes an n-GaN layer formed on a substrate to have a plurality of protrusions, thereby having an uneven surface, wherein a side surface of the protrusions is inclined with a first inclination angle $\alpha$ ($35° \leq \alpha \leq 90°$) with respect to an upper surface of the substrate; an active layer conformally formed on the surface of the n-GaN layer, wherein the surface of the active layer formed on the side surface of the protrusions is inclined with a second inclination angle $\beta$ ($35° \leq \beta \leq \alpha$) with respect to the upper surface of the substrate; a p-GaN layer conformally formed on the surface of the active layer, wherein the surface of the p-GaN layer formed on the surface of the inclined portion of the active layer is inclined with a third inclination angle $\gamma$ ($20° \leq \gamma \leq \beta$) with respect to the upper surface of the substrate; and an n-electrode formed on a predetermined area of the n-GaN layer to correspond to the p-electrode.

6 Claims, 8 Drawing Sheets

LIGHT EMITTING DIODE AND METHOD OF FABRICATING THE SAME

CROSS-REFERENCE TO RELATED PATENT APPLICATION

This application claims the benefit of Korean Patent Application No. 10-2005-0062926, filed on Jul. 12, 2005, in the Korean Intellectual Property Office, the disclosure of which is incorporated herein in its entirety by reference.

BACKGROUND OF THE DISCLOSURE

1. Field of the Disclosure

The present disclosure relates to a light emitting diode and a method of fabricating the same, and more particularly, to a light emitting diode and a method of fabricating the same with an improved structure capable of increasing the light emitting efficiency and the light output efficiency.

2. Description of the Related Art

A light emitting diode (LED) is a semiconductor device, which emits light by electrons moving from a point of high energy level to a point of low energy level when an electric power is applied to it. A LED consumes 1/12 of the power of the conventional light source, and has 100-time longer life time, and 1000-time faster response speed than the conventional light source. Moreover, the LED emits light of high brightness with low power consumption, and is regarded as the optimal light source for very large electric display signs. The light color of the LED varies depending on which compound material is used, such as GaP or GaAs. Red and green LEDs were developed decades ago and have been used widely in various industrial fields and in home electronic appliances.

The LED is categorized into a top-emitting light emitting diode (TLED) and a flip-chip light emitting diode (FCLED) according to the direction of the light. The TLED emits light through a p-type compound semiconductor layer and a p-type electrode which forms an ohmic contact. The p-type electrode is a stack of Ni and Au loaded sequentially on the p-type compound semiconductor layer. However, the p-type electrode formed of Ni and Au is semi-transparent, and the TLED in which the p-type electrode is applied has a low light utility efficiency and a low luminescence character. In the FCLED, light generated in an active layer is reflected on a reflection electrode formed on the p-type compound semiconductor layer, and the reflected light is emitted through the substrate. The reflection electrode is formed of a material having a high light-reflective characteristic, such as Ag, Al, and Rh. A FCLED in which the reflection electrode is applied has a high light utility efficiency and a high luminescence characteristic.

A LED with a micro-reflector structure has been developed to enhance the light output efficiency of a conventional LED. When fabricating a LED with a micro-reflector structure using nitride semiconductors, an uneven structure can be obtained by etching a p-GaN layer or etching the lower part of an active layer. However, in an uneven structure obtained by etching a p-GaN layer, current injection may be problematic because of the thickness reduction of the p-GaN layer. Also, in an uneven structure obtained by etching the lower part of the active layer, light emitting efficiency may be reduced due to the reduction of the area of the active layer. In addition, an electric insulation layer is required between an n-GaN layer and a p-GaN layer, thereby complicating the electrode formation process. Therefore, an improved structure for improving the light emitting efficiency and the light output efficiency of the LED is needed.

SUMMARY OF THE DISCLOSURE

The present invention may provide a light emitting diode (LED) and a method of fabricating the LED with an improved structure for increasing the light emitting efficiency and the light output efficiency.

According to an aspect of the present invention, there may be provided a light emitting diode (LED) comprising: an n-GaN layer formed on a substrate to have a plurality of protrusions, thereby having an uneven surface, wherein a side surface of the protrusions is inclined with a first inclination angle $\alpha$ ($35° \leq \alpha \leq 90°$) with respect to an upper surface of the substrate; an active layer conformally formed on the surface of the n-GaN layer, wherein the surface of the active layer formed on the side surface of the protrusions is inclined with a second inclination angle $\beta$ ($35° \leq \beta \leq \alpha$) with respect to the upper surface of the substrate; a p-GaN layer conformally formed on the surface of the active layer, wherein the surface of the p-GaN layer formed on the surface of the inclined portion of the active layer is inclined with a third inclination angle $\gamma$ ($20° \leq \gamma \leq \beta$) with respect to the upper surface of the substrate; a p-electrode formed on the p-GaN layer; and an n-electrode formed on a predetermined area of the n-GaN layer to correspond to the p-electrode.

According to an aspect of the present invention, there may be provided a method of fabricating the LED, comprising: providing a substrate; forming an n-GaN layer on the substrate; patterning the n-GaN layer to form a plurality of protrusions, wherein a side surface of the protrusions is inclined with a first inclination angle $\alpha$ ($35° \leq \alpha \leq 90°$) with respect to an upper surface of the substrate on the n-GaN layer; forming an active layer on the surface of the n-GaN layer, wherein the surface of the active layer formed on the side surface of the protrusions is inclined with a second inclination angle $\beta$ ($35° \leq \beta \leq \alpha$) with respect to the upper surface of the substrate; forming a p-GaN layer on the surface of the active layer, wherein the surface of the p-GaN layer formed on the surface of the inclined portion of the active layer is inclined with a third inclination angle $\gamma$ ($20° \leq \gamma \leq \beta$) with respect to the upper surface of the substrate; exposing a predetermined area of the n-GaN layer to form an n-electrode thereon; and forming a p-electrode on the p-GaN layer.

Preferably, the third inclination angle is from 20° to 40°, and the first inclination angle is from 35° to 70°. The p-electrode can be formed of a metal having high reflectivity, and a $SiO_2$ layer having a thickness equal to one fourth of a wavelength of emitted light is further interposed between the p-GaN layer and the p-electrode. The surface of the p-GaN layer is not parallel with the inclined surface of the active layer and the side surface of the protrusions.

According to the present invention, an LED with improved light emitting efficiency and light output efficiency can be obtained.

BRIEF DESCRIPTION OF THE DRAWINGS

The above and other features and advantages of the present invention will be described in detailed exemplary embodiments thereof with reference to the attached drawings in which.

DETAILED DESCRIPTION OF EXEMPLARY EMBODIMENTS

Figure 1:
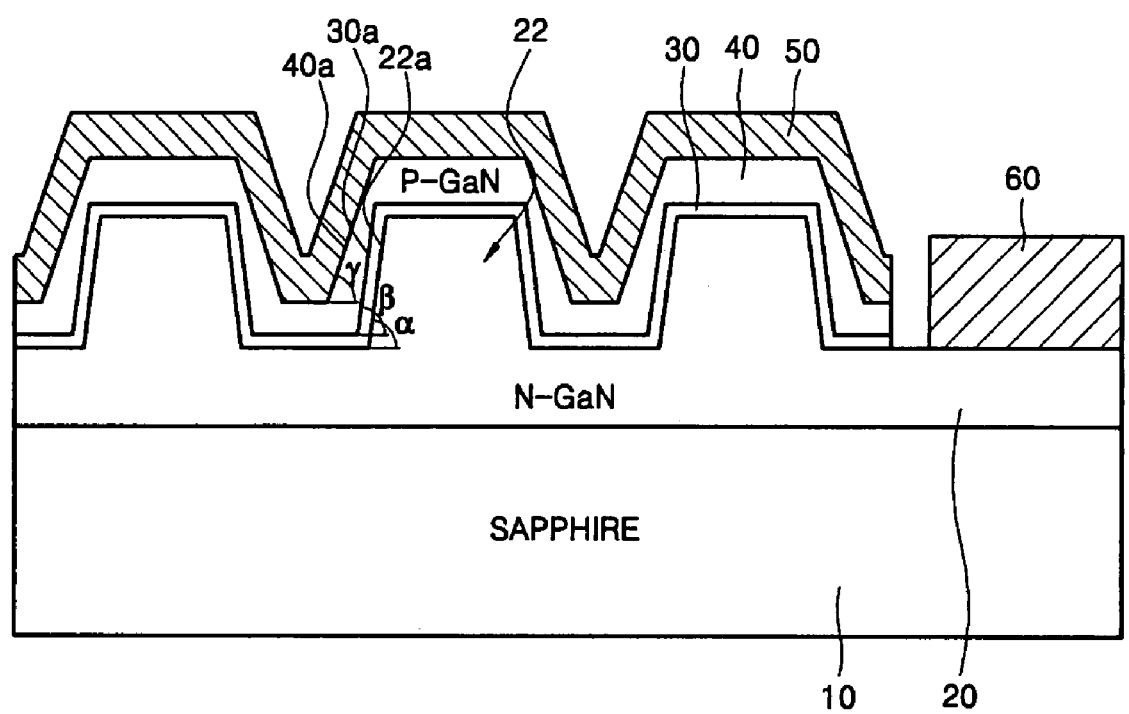
FIG. 1 is a schematic cross-sectional view of a light emitting diode (LED) according to an embodiment of the present invention.

Preferred embodiments of the present invention will now be described with reference to the attached drawings. In the drawings, the thicknesses of layers and regions are exaggerated for clarity.

FIG. 1 is a schematic cross-sectional view of a light emitting diode (LED) according to an embodiment of the present invention. Referring to FIG. 1, the LED includes a n-GaN layer 20 alternately disposed on a substrate 10, an active layer 30, a p-GaN layer 40, a p-electrode 50, and an n-electrode 60 formed on a predetermined surface area of the p-GaN layer 20. In the present embodiment, light is emitted from the active layer 30 and is reflected to the p-electrode 50 formed on the p-GaN layer 40, and the reflected light is emitted through the substrate 10.

The n-GaN layer 20 is formed to have a plurality of protrusions 22, thereby having an uneven surface. The protrusions 22 have a side 22a inclined with respect to the upper surface of the substrate 10 at a first inclination angle $\alpha$ ($35° \leq \alpha \leq 90°$). Also, the active layer 30 is conformally formed on the n-GaN layer 20 on the surface of the n-GaN layer 20. The active layer 30 has an inclined surface 30a having a second inclination angle $\beta$ ($35° \leq \beta \leq \alpha$) to the upper surface of the substrate 10. The second inclination angle $\beta$ is equal to or less than the first inclination angle $\alpha$. The surface area of the active layer 30 may increase with the second inclination angle $\beta$, and the light emitting efficiency may increase with the area increase. Preferably, the second inclination angle $\beta$ of the active layer 30 has the maximum possible value.

The p-GaN layer 40 is formed on the surface of the active layer 30. The p-GaN layer 40 has an inclined surface 40a with a third inclination angle $\gamma$ ($20° \leq \gamma < \beta$) with respect to the substrate 10. The inclined surface 40a of the p-GaN layer 40 may have a smaller inclination angle than the inclined surface 30a of the active layer 30. Accordingly, the light reflection efficiency of the p-electrode 50 formed on the p-GaN layer 40 can be increased. The p-electrode 50 is formed of a metal having good light reflection characteristic such as Ag, Al, and Rh. According to the experimental results, the highest light output efficiency is obtained with a third inclination angle $\gamma$ between 20° and 40° and a first inclination angle $\alpha$ between 35° and 70°. According to an embodiment of the present invention, the light emitting efficiency of the active layer 30 and light reflection efficiency of the p-electrode 50 are increased together when the inclined surface 40a of the p-GaN layer 40 is formed to have an inclination angle smaller than the inclination angle of the inclined surface 30a of the active layer 30 and the side surface 22a of the protrusions 22. In this instance, the light output efficiency is also increased.

Preferably, a $SiO_2$ layer having a thickness equal to one fourth of the wavelength of emitted light can be further interposed between the p-GaN layer 40 and the p-electrode 50. The $SiO_2$ layer can improve the light reflection characteristic of the p-electrode 50.

Figure 2:
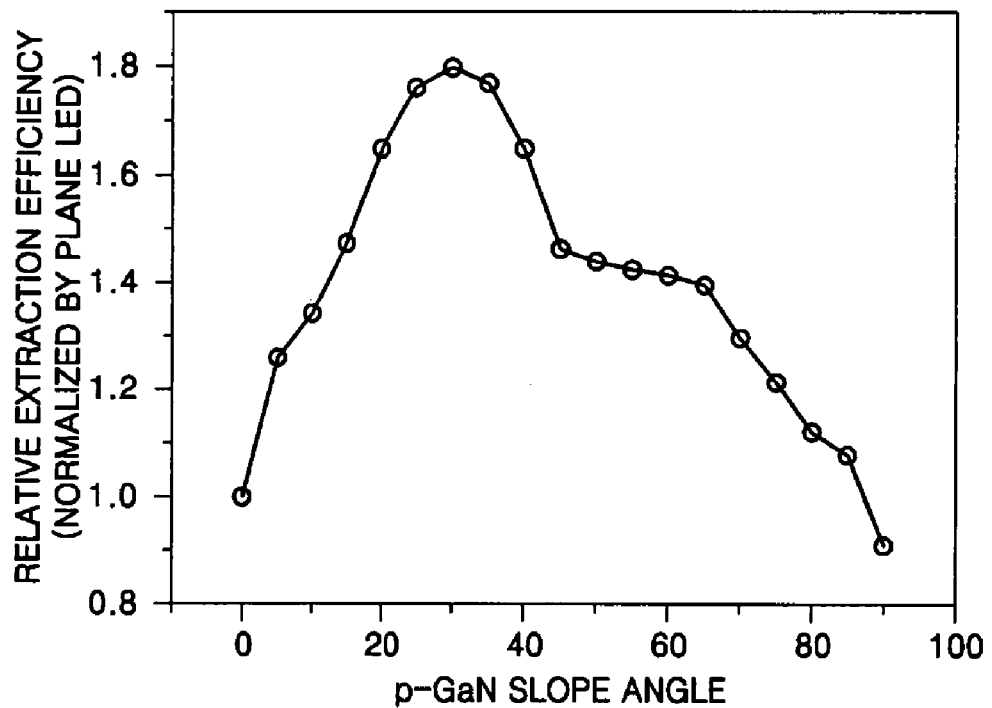
FIG. 2 is a graph illustrating variation of the light output efficiency of the LED of FIG. 1 according to the increase of the inclination angle of a p-GaN layer.
Figure 3:
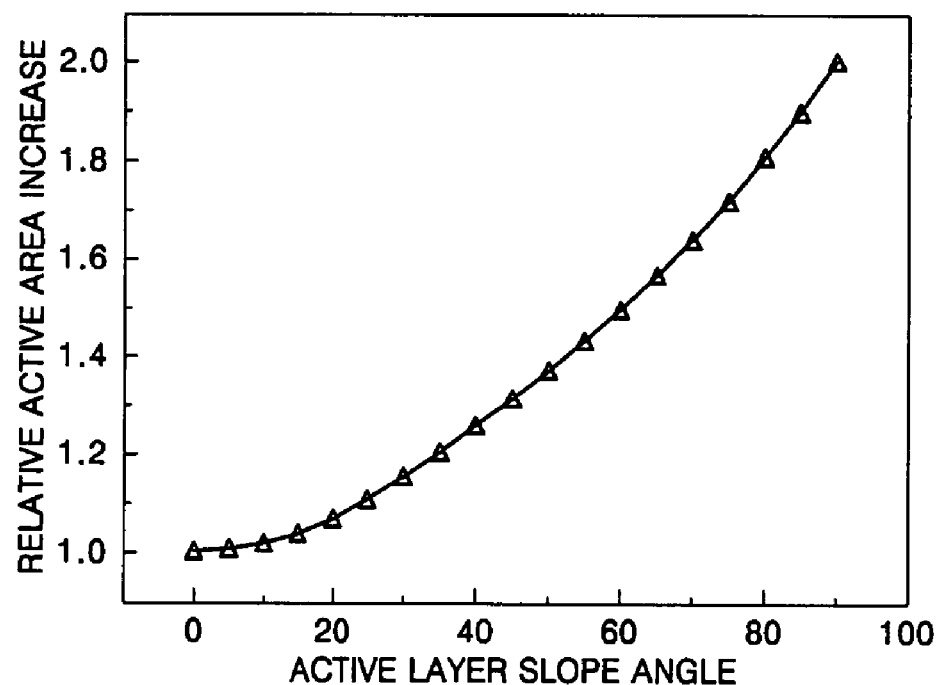
FIG. 3 is a graph illustrating active area variation of the active layer according to the increase of the layer slope.

FIG. 2 is a graph illustrating variation of light output efficiency of the LED of FIG. 1 according to the increase of the inclination angle of the p-GaN layer. FIG. 3 is a graph illustrating the area variation of the active layer in the LED of FIG. 1 according to the increase of the layer slope. Referring to FIGS. 2 and 3, the light output efficiency is increased to the maximum amount when the inclination angle of the p-GaN layer is between 20° and 30°. Also, as the inclination angle of the active layer increases, the area of the active layer increases.

Figure 4:
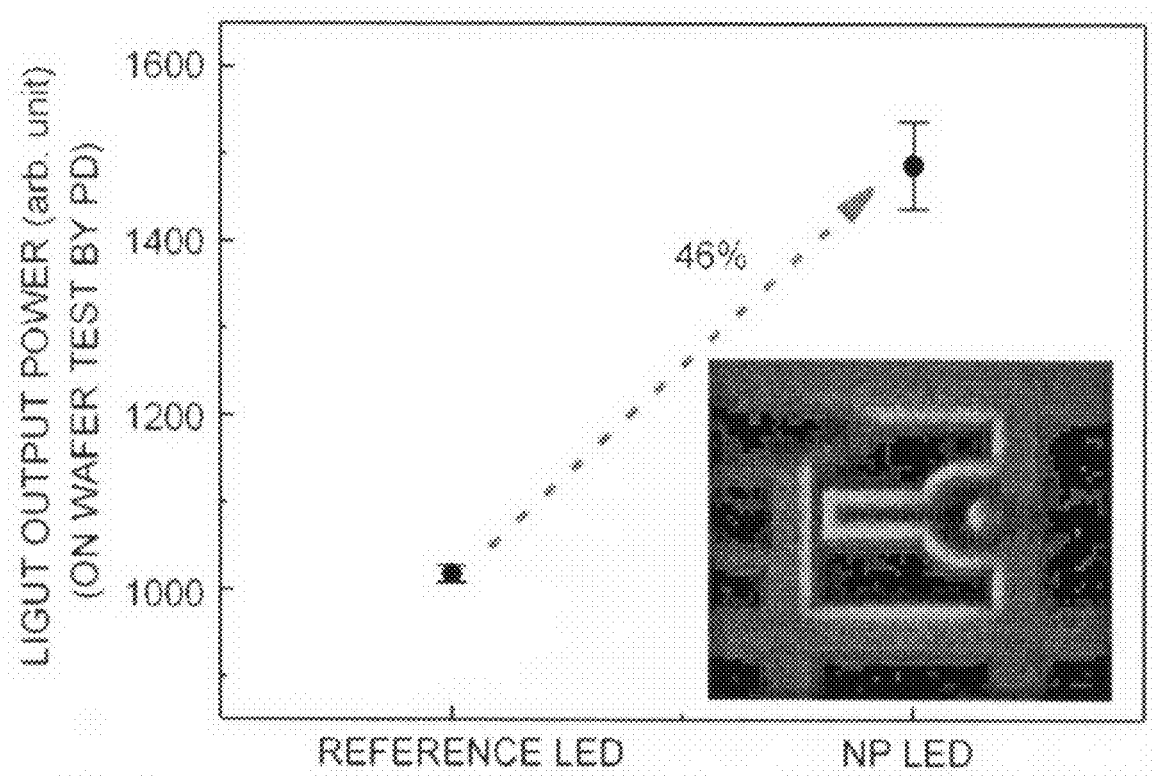
FIG. 4 is a graph illustrating the light output efficiency of the LED of FIG. 1.

FIG. 4 is a graph illustrating the light output efficiency of the LED of FIG. 1 according to an embodiment of the present invention. FIGS. 5A through 5G are flowcharts respectively illustrating steps in a process of manufacturing the LED of FIG. 1 according to an embodiment of the present invention.

Figure 5A:
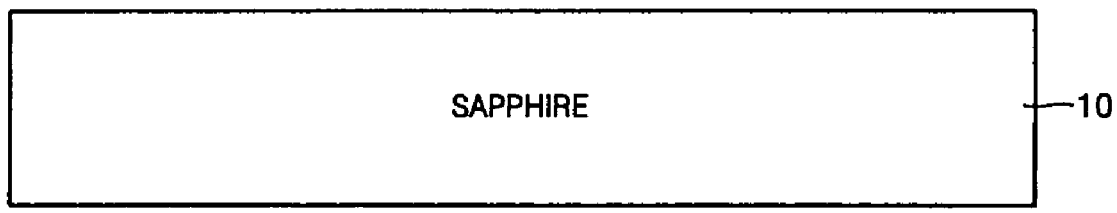
FIGS. 5A through 5G are flowcharts illustrating a process of manufacturing the LED of FIG. 1 according to an embodiment of the present invention.
Figure 5B:
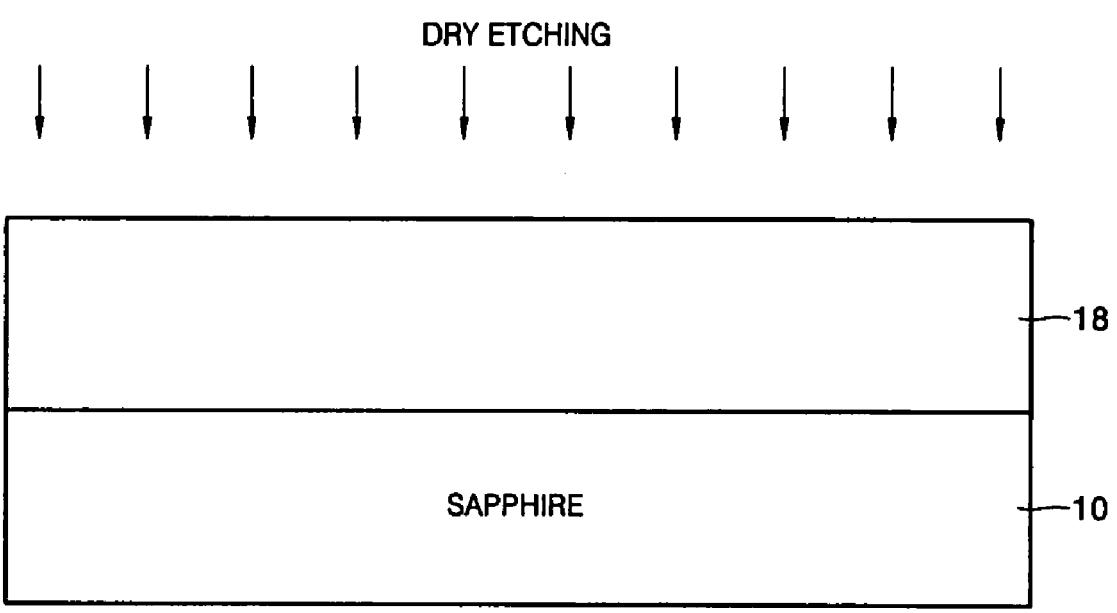
Figure 5C:
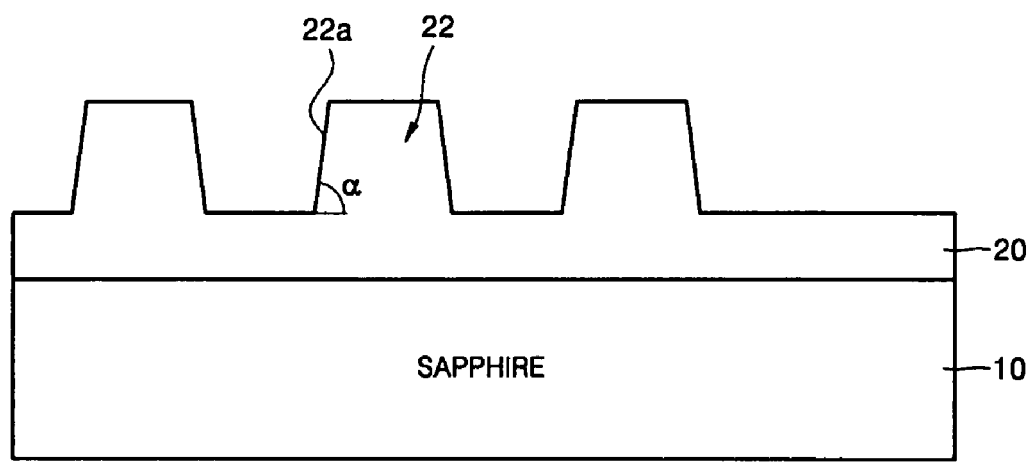

Referring to FIGS. 5A through 5C, first, a substrate 10 with an n-GaN layer 18 of a predetermined thickness is provided. Then, the n-GaN layer 18 is patterned by a method such as dry etching. A plurality of protrusions 22 are formed on a side surface 22a of the n-GaN layer 18 having an inclination angle as great as the first inclination angle $\alpha$ ($35° \leq \alpha \leq 90°$), and thus an n-GaN layer 20 having the protrusions 22 is obtained. The first inclination angle $\alpha$ may be between 35° and 70°.

Figure 5D:
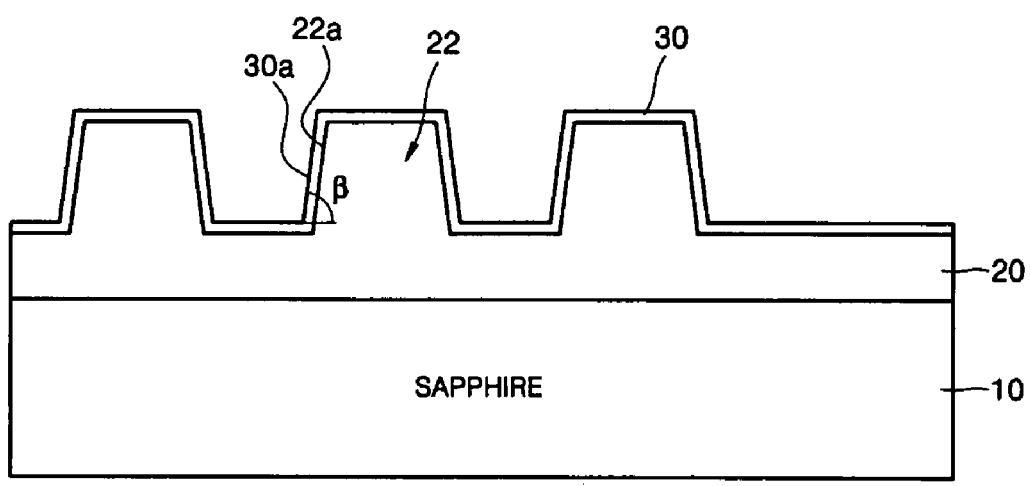

Referring to FIG. 5D, an active layer 30 is conformally formed on the surface of the p-GaN layer 20. Also, an inclined surface 30a of the active layer 30 is formed on the side surface 22a of the protrusions 22 with a second inclination angle $\beta$ ($35° \leq \beta \leq \alpha$) with respect to the upper surface of the substrate 10. The second inclination angle $\beta$ can be controlled by adjusting the ratio of vertical growth to lateral growth of the active layer 30 by changing process variables such as temperature, pressure, and the composition ratio of Group 5 elements to Group 3 elements ($NH_3$:TMGa). For instance, when the temperature is increased or the pressure is reduced or the ratio of Group 5 elements to Group 3 elements ($NH_3$:TMGa) is increased compared to the basic growth conditions, the inclination degree of a pattern gradually decreases.

Figure 5E:
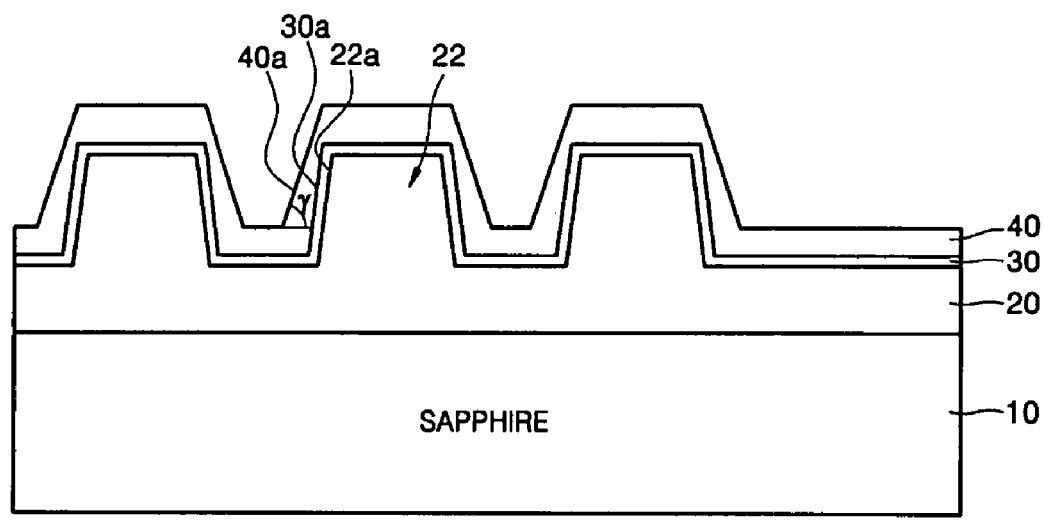

Referring to FIG. 5E, a p-GaN layer 40 is conformally formed on the surface of the active layer 30. Also, an inclined surface 40a of the p-GaN layer 40 is formed on the inclined surface 30a of the active layer 30 with a third inclination angle $\gamma$ ($20° \leq \gamma \leq \beta$) with respect to the upper surface of the substrate 10. In the same manner, the third inclination angle $\gamma$ can be controlled by adjusting the ratio of vertical growth to lateral growth of the active layer 30 by changing process variables such as temperature, pressure, and the composition ratio of Group 5 elements to Group 3 elements ($NH_3$:TMGa). For instance, when the temperature is increased or the pressure is reduced, or the ratio of Group 5 elements to Group 3 elements ($NH_3$:TMGa) is increased compared to the basic growth conditions, the inclination degree of a pattern gradually decreases. The third inclination angle $\gamma$ may be between 20° and 30°.

Figure 5F:
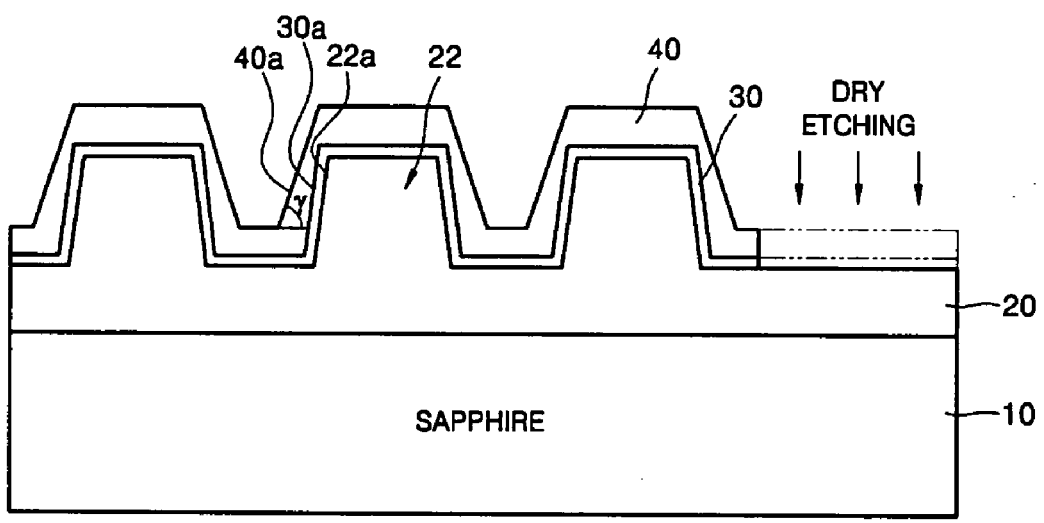
Figure 5G:
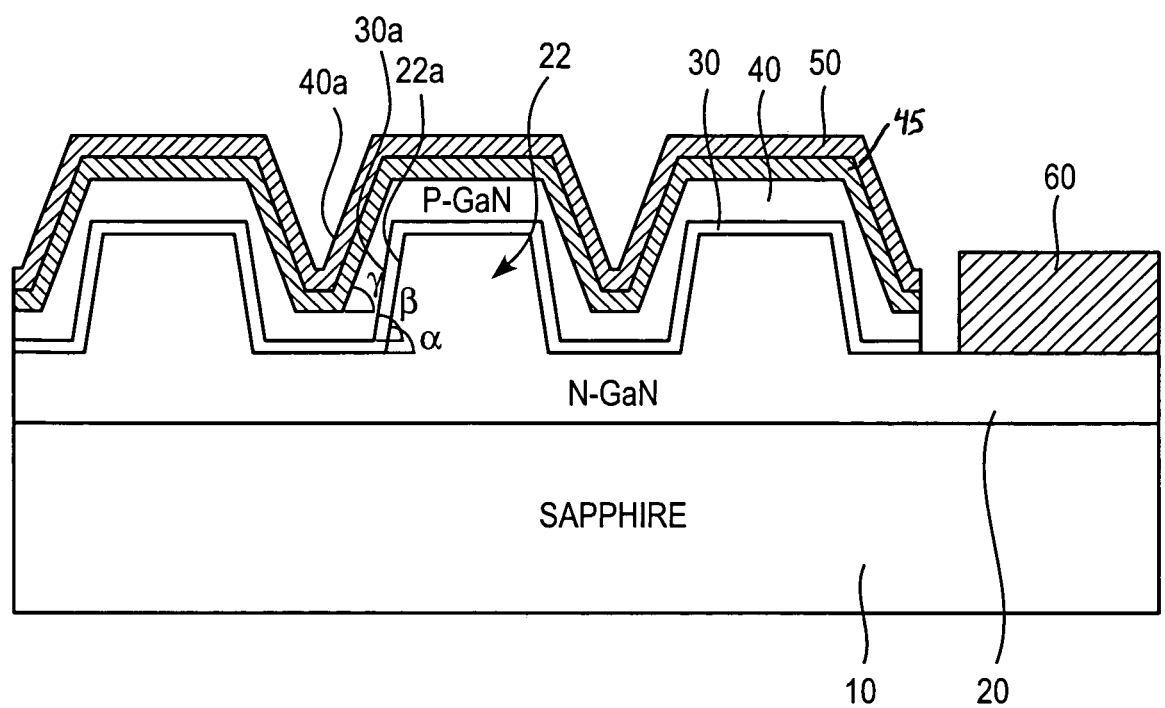

Referring to FIGS. 5F and 5G, a predetermined surface area of the n-GaN layer 20 is exposed by a method such as dry etching, and an n-electrode 60 is formed thereon of a conductive material. Then, a p-electrode 50 is formed on the p-GaN layer 40 of a metal having good light reflection property, such as Ag, Al, and Rh. Through such process, an LED with improved light emitting efficiency and light output efficiency is obtained.

Preferably, a SiO$_2$ layer 45 with a thickness equal to one fourth of the wavelength of emitted light can be further interposed between the p-GaN layer 40 and the p-electrode 50. The SiO$_2$ layer 45 can improve the light reflection characteristic of the p-electrode 50.

Figure 6:
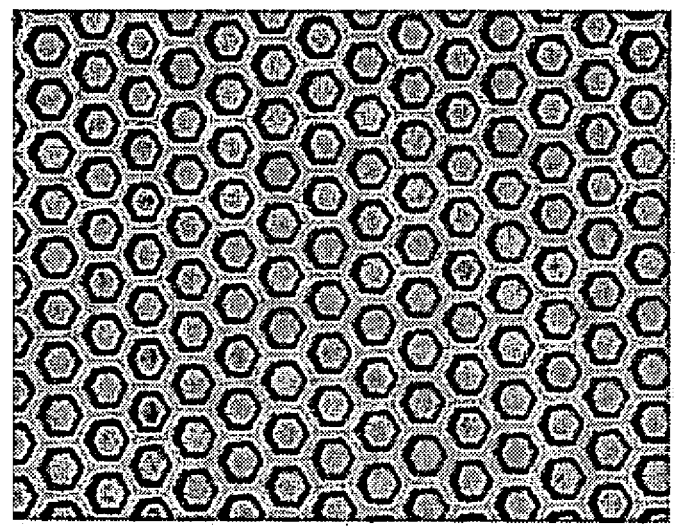
FIG. 6 is an optical microscope presentation showing an upper surface of a patterned n-GaN layer of FIG. 5C.
Figure 7:
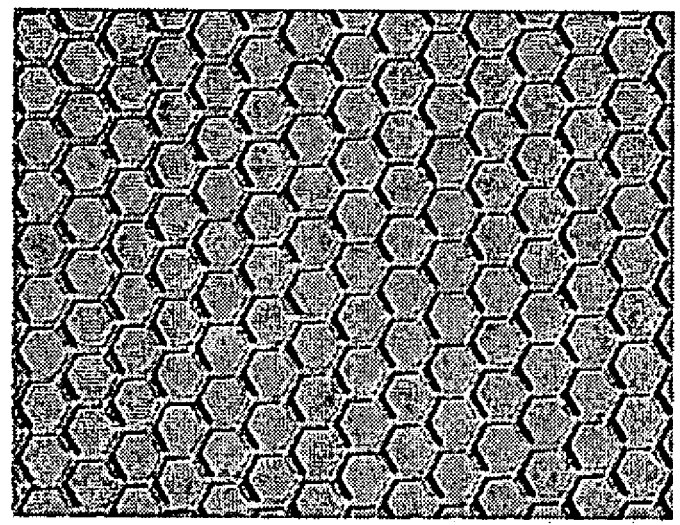
FIG. 7 is an optical microscope presentation showing an upper surface of a p-GaN layer of FIG. 5E.

FIG. 6 is an optical microscope presentation showing an upper surface of the patterned n-GaN layer of FIG. 5C. FIG. 7 is an optical microscope presentation showing an upper surface of the p-GaN layer of FIG. 5E.

According to the present invention, an LED with improved light emitting efficiency and light output efficiency is obtained. More specifically, the light emitting efficiency of the inside of the LED is improved by increasing the surface area of the active layer according to the inclination angle of the active layer. Moreover, when the inclination angle of the p-GaN layer is smaller than the inclination angle of the active layer, the light reflection efficiency of the reflection electrode formed on the p-GaN layer can be increased. Accordingly, the light output efficiency of the LED according to the present invention increases by 46% compared to a conventional LED.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a LED, comprising:
providing a substrate;
forming an n-GaN layer on the substrate;
patterning the n-GaN layer to form a plurality of protrusions, wherein a side surface of the protrusions is inclined with a first inclination angle $\alpha$ ($35° \leq \alpha \leq 90°$) with respect to an upper surface of the substrate;
forming an active layer on the surface of the n-GaN layer, wherein the surface of the active layer formed on the side surface of the protrusions is inclined with a second inclination angle $\beta$ ($35° \leq \beta \leq \alpha$) with respect to the upper surface of the substrate;
forming a p-GaN layer on the surface of the active layer, wherein the surface of the p-GaN layer formed on the surface of the inclined portion of the active layer is inclined with a third inclination angle $\gamma$ ($20° \leq \gamma \leq \beta$) with respect to the upper surface of the substrate;
exposing a predetermined area of the n-GaN layer to form an n-electrode thereon; and
forming a p-electrode on the p-GaN layer,
wherein an inclined surface of the p-GaN layer is formed not to be parallel with an inclined surface of the active layer and a side surface of the protrusions.

2. The method of claim 1, wherein in the forming of the p-GaN layer, the third inclination angle is controlled by adjusting a ratio of vertical growth to lateral growth of the p-GaN layer.

3. The method of claim 1, wherein the third inclination angle is from 20° to 40°.

4. The method of claim 1, wherein the first inclination angle is from 35° to 70°.

5. The method of claim 1, wherein the p-electrode is formed having a metal of high reflectivity.

6. The method of claim 1, further comprising forming a SiO2 layer equal to a thickness of one fourth of a wavelength on the p-GaN layer between the forming of the p-GaN layer and the forming of the p-electrode.

* * * * *